(12) United States Patent
Nakanishi et al.

(10) Patent No.: US 8,791,507 B2
(45) Date of Patent: Jul. 29, 2014

(54) SEMICONDUCTOR DEVICE

(71) Applicant: Panasonic Corporation, Osaka (JP)

(72) Inventors: Kazuyuki Nakanishi, Osaka (JP); Masaki Tamaru, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/846,514

(22) Filed: Mar. 18, 2013

(65) Prior Publication Data

US 2013/0234211 A1  Sep. 12, 2013

Related U.S. Application Data

(60) Division of application No. 13/020,566, filed on Feb. 3, 2011, now Pat. No. 8,431,967, which is a continuation of application No. PCT/JP2010/005210, filed on Aug. 24, 2010.

(30) Foreign Application Priority Data

Oct. 19, 2009  (JP) .................................. 2009-240501

(51) Int. Cl.
*H01L 27/118*  (2006.01)

(52) U.S. Cl.
USPC ........... 257/203; 257/202; 257/304; 257/205; 257/206; 257/207; 257/208; 257/209; 257/210; 257/211; 438/206; 438/279; 438/128; 438/5; 438/129

(58) Field of Classification Search
USPC .......... 257/E27.081, E27.013, 202–211, 390, 257/401; 438/206, 279, 128, 5, 129
See application file for complete search history.

(56) References Cited

U.S. PATENT DOCUMENTS 4,651,190 A * 3/1987 Suzuki et al. .................. 257/206
4,701,777 A * 10/1987 Takayama et al. ............ 257/206
(Continued)

FOREIGN PATENT DOCUMENTS

JP     10-032253 A    2/1998
JP     2005-116557 A  4/2005
(Continued)

OTHER PUBLICATIONS

Notice of Allowance mailed Jan. 10, 2013 issued in corresponding U.S. Appl. No. 13/020,566.
(Continued)

*Primary Examiner* — Fernando L Toledo
*Assistant Examiner* — Mohammed Shamsuzzaman
(74) *Attorney, Agent, or Firm* — McDermott Will & Emery LLP

(57) ABSTRACT

A layout of a semiconductor device is capable of reliably reducing a variation in gate length due to the optical proximity effect, and enables flexible layout design to be implemented. Gate patterns (G1, G2, G3) of a cell (C1) are arranged at the same pitch, and terminal ends (e1, e2, e3) of the gate patterns are located at the same position in the Y direction, and have the same width in the X direction. A gate pattern (G4) of a cell (C2) has protruding portions (4b) protruding toward the cell (C1) in the Y direction, and the protruding portions (4b) form opposing terminal ends (eo1, eo2, eo3). The opposing terminal ends (eo1, eo2, eo3) are arranged at the same pitch as the gate patterns (G1, G2, G3), are located at the same position in the Y direction, and have the same width in the X direction.

3 Claims, 11 Drawing Sheets

(56) References Cited

U.S. PATENT DOCUMENTS

| | | | | |
|---|---|---|---|---|
| 5,060,046 | A * | 10/1991 | Shintani | 257/206 |
| 5,281,835 | A * | 1/1994 | Tomita et al. | 257/204 |
| 5,672,895 | A * | 9/1997 | Iida et al. | 257/357 |
| 5,847,421 | A | 12/1998 | Yamaguchi | |
| 6,194,252 | B1 * | 2/2001 | Yamaguchi | 438/129 |
| 6,285,088 | B1 * | 9/2001 | Madan | 257/202 |
| 6,351,304 | B1 * | 2/2002 | Kawashima et al. | 355/55 |
| 6,376,130 | B1 * | 4/2002 | Stanton | 430/5 |
| 6,399,972 | B1 * | 6/2002 | Masuda et al. | 257/206 |
| 6,525,350 | B1 * | 2/2003 | Kinoshita et al. | 257/202 |
| 6,538,269 | B2 * | 3/2003 | Maeda | 257/202 |
| 6,642,555 | B1 * | 11/2003 | Ishida | 257/202 |
| 6,660,462 | B1 * | 12/2003 | Fukuda | 430/394 |
| 6,698,007 | B2 * | 2/2004 | Wu et al. | 716/52 |
| 6,707,107 | B2 * | 3/2004 | Kido | 257/354 |
| 6,787,823 | B2 * | 9/2004 | Shibutani | 257/206 |
| 6,981,240 | B2 * | 12/2005 | Pierrat et al. | 430/5 |
| 7,083,879 | B2 * | 8/2006 | Pierrat et al. | 430/5 |
| 7,137,092 | B2 * | 11/2006 | Maeda | 716/53 |
| 7,190,050 | B2 * | 3/2007 | King et al. | 257/622 |
| 7,279,727 | B2 * | 10/2007 | Ikoma et al. | 257/204 |
| 7,302,660 | B2 * | 11/2007 | Shimamura | 257/206 |
| 7,326,595 | B2 * | 2/2008 | Kuroki | 438/128 |
| 7,685,551 | B2 * | 3/2010 | Toubou et al. | 716/119 |
| 7,698,680 | B2 * | 4/2010 | Kim | 716/129 |
| 7,704,837 | B2 * | 4/2010 | Masuda et al. | 438/279 |
| 7,800,140 | B2 * | 9/2010 | Nakanishi et al. | 257/213 |
| 7,927,782 | B2 * | 4/2011 | Aton | 430/313 |
| 8,013,361 | B2 * | 9/2011 | Yamashita et al. | 257/202 |
| 8,023,352 | B2 * | 9/2011 | Masuoka et al. | 365/210.1 |
| 8,159,013 | B2 * | 4/2012 | Nishimura et al. | 257/296 |
| 8,176,443 | B2 * | 5/2012 | Rathsack et al. | 716/50 |
| 2003/0018948 | A1 * | 1/2003 | Chang et al. | 716/8 |
| 2003/0062632 | A1 * | 4/2003 | Yokota et al. | 257/797 |
| 2004/0014272 | A1 * | 1/2004 | Shibutani | 438/206 |
| 2005/0001271 | A1 * | 1/2005 | Kobayashi | 257/368 |
| 2005/0076316 | A1 * | 4/2005 | Pierrat et al. | 716/4 |
| 2005/0076320 | A1 | 4/2005 | Maeda | |
| 2005/0274983 | A1 * | 12/2005 | Hayashi et al. | 257/206 |
| 2005/0280031 | A1 * | 12/2005 | Yano | 257/202 |
| 2006/0017070 | A1 * | 1/2006 | Ikoma et al. | 257/213 |
| 2006/0271902 | A1 * | 11/2006 | Yamashita et al. | 716/17 |
| 2007/0004147 | A1 | 1/2007 | Toubou et al. | |
| 2009/0034317 | A1 * | 2/2009 | Tomita et al. | 365/104 |
| 2009/0159977 | A1 * | 6/2009 | Itou | 257/368 |
| 2009/0300567 | A1 * | 12/2009 | Rathsack et al. | 716/8 |
| 2010/0006896 | A1 * | 1/2010 | Uemura | 257/202 |
| 2010/0044755 | A1 * | 2/2010 | Tsuda et al. | 257/206 |
| 2010/0142257 | A1 * | 6/2010 | Masuoka et al. | 365/149 |
| 2010/0148235 | A1 | 6/2010 | Toubou et al. | |
| 2010/0308377 | A1 * | 12/2010 | Nakanishi et al. | 257/202 |
| 2011/0049575 | A1 * | 3/2011 | Tanaka | 257/206 |
| 2011/0278679 | A1 * | 11/2011 | Tabata et al. | 257/390 |
| 2011/0298030 | A1 * | 12/2011 | Masuoka et al. | 257/306 |
| 2011/0298138 | A1 * | 12/2011 | Ozoe et al. | 257/773 |

FOREIGN PATENT DOCUMENTS

| | | |
|---|---|---|
| JP | 2006-005103 A | 1/2006 |
| JP | 2007-012855 A | 1/2007 |
| JP | 2009-152437 A | 7/2009 |

OTHER PUBLICATIONS

International Search Report mailed Nov. 22, 2010 issued in corresponding International Application No. PCT/JP2010/005210.

* cited by examiner

- ▨ GATE PATTERN
- ▨ DIFFUSION REGION
- — CELL BOUNDARY
- ▨ CONTACT
- ▨ METAL

SEMICONDUCTOR DEVICE

CROSS-REFERENCE TO RELATED APPLICATION

This is a Divisional application of application Ser. No. 13/020,566 filed on Feb. 3, 2011, now U.S. Pat. No. 8,431,967, which is a continuation of PCT International Application PCT/JP2010/005210 filed on Aug. 24, 2010, which claims priority to Japanese Patent Application No. 2009-240501 filed on Oct. 19, 2009. The disclosures of these applications including the specifications, the drawings, and the claims are hereby incorporated by reference in their entirety.

BACKGROUND

The present invention relates to layouts of semiconductor devices, and more particularly to techniques effective in reducing the optical proximity effect.

In manufacturing processes of semiconductor integrated circuits, integrated circuits are typically formed on semiconductor substrates by repeating a photolithography step including resist application, exposure, and development, an etching step for patterning elements by using a resist mask, and a resist removing step. If pattern dimensions are equal to or less than an exposure wavelength in the exposure of the photolithography step, the amount of error between designed layout dimensions and the pattern dimensions on the semiconductor substrate increases due to the optical proximity effect produced by diffracted light.

In the semiconductor integrated circuits, the transistor gate length is an important factor that determines the capability of the semiconductor integrated circuits. Thus, if errors in gate dimensions are caused in the manufacturing processes, such errors greatly affect the operational capability of the semiconductor integrated circuits.

Thus, with increasing miniaturization, it is becoming increasingly necessary to correct dimensional errors of patterns caused by the optical proximity effect, when drawing and exposing the patterns such as interconnects in the manufacturing processes of the semiconductor integrated circuits. One technique of correcting the optical proximity effect is optical proximity effect correction (OPC). OPC is a technique in which a variation in gate length due to the optical proximity effect is predicted from the distance from a gate to another gate pattern close to the gate, and a mask value of a photoresist mask for forming the gate is corrected in advance so as to offset the predicted variation, thereby maintaining a constant finished gate length after exposure.

Conventionally, however, since gate patterns have not been standardized, and the gate length and the gate interval vary from region to region in an entire chip, the gate mask correction by OPC increases the turn around time (TAT) and the amount of processing.

In order to avoid such problems, the gate length and the gate interval are limited to one or several values in the layout described in, e.g., Japanese Patent Publication No. 2007-12855. Thus, a constant finished gate length can be maintained without performing the gate mask correction by OPC, whereby a variation in gate length due to the optical proximity effect can be reduced.

SUMMARY

However, flexibility of layout design is reduced if the gate dimensions are limited to one or several values as in Japanese Patent Publication No. 2007-12855. Thus, for example, in the case of placing capacitance transistors having a greater gate length than normal transistors, it is impractical to limit the gate dimensions as in Japanese Patent Publication No. 2007-12855. Note that the term "capacitance transistor" refers to a transistor having its source and drain fixed to the power supply potential or the ground potential, and serving as a capacitor between the power supply and the ground.

FIG. 11 shows an example of a layout pattern of a semiconductor device in which a capacitance transistor is placed. In FIG. 11, gate patterns G1, G2, G3 are placed in a standard cell C1, and a gate pattern G4 is placed in a standard cell C2. The gate pattern G4 forms a capacitance transistor T2 having a greater gate length than a transistor T1.

In a region R1, terminal ends of the gate patterns G1, G2, G3 face an end of the gate pattern G4. The gate patterns G1, G2, G3 have a width L1 and are arranged at an interval S1, whereas the gate pattern G4 has a width L2 that is significantly greater than the width L1, and occupies a wide area. Thus, the terminal ends of the gate patterns G1, G2, G3 and the end of the gate pattern G4 have no shape regularity, which results in a variation in gate length due to the optical proximity effect.

In order to reduce such a variation in gate length due to the optical proximity effect, the gate pattern interval S2 in FIG. 11, for example, can be increased to a sufficiently large value, but this increases the circuit area.

It is an object of the present invention to provide a layout of a semiconductor device, which is capable of reliably reducing a variation in gate length due to the optical proximity effect, and enables flexible layout design to be implemented.

A semiconductor device according to a first aspect of the present invention includes: a first cell having at least three gate patterns extending in a first direction and arranged at a same pitch in a second direction perpendicular to the first direction; and a second cell adjoining the first cell in the first direction. The gate patterns of the first cell are terminated near a cell boundary with the second cell, and terminal ends of the gate patterns are located at a same position in the first direction, and have a same width in the second direction. The second cell includes a plurality of opposing terminal ends formed by a gate pattern, and placed near the cell boundary so as to face the terminal ends of the gate patterns of the first cell. The opposing terminal ends are arranged at the same pitch as the gate patterns of the first cell in the second direction, are located at a same position in the first direction, and have a same width in the second direction. At least some of the plurality of opposing terminal ends are formed by at least two protruding portions protruding from a single first gate pattern of the second cell toward the first cell in the first direction.

According to the first aspect, the at least three gate patterns of the first cell are arranged at the same pitch, and the terminal ends of the gate patterns are located at the same position in the first direction, and have the same width in the second direction. The second cell, which adjoins the first cell in the first direction, has the first gate pattern having the at least two protruding portions extending toward the first cell in the first direction. These protruding portions form the opposing terminal ends placed so as to face the terminal ends of the gate patterns of the first cell. The opposing terminal ends are arranged at the same pitch as the gate patterns of the first cell, are located at the same position in the first direction, and have the same width in the second direction. That is, since the terminal ends of the gate patterns of the first cell and the opposing terminal ends of the gate pattern of the second cell have the same shape regularity, a variation in gate length due to the optical proximity effect can be reliably reduced. Moreover, the first gate pattern in the second cell can be used as, e.g., a transistor having a great gate length.

A semiconductor device according to a second aspect of the present invention includes: a first cell having at least three gate patterns extending in a first direction and arranged at a same pitch in a second direction perpendicular to the first direction; and a second cell adjoining the first cell in the first direction. The gate patterns of the first cell are terminated near a cell boundary with the second cell, and terminal ends of the gate patterns are located at a same position in the first direction, and have a same width in the second direction. The second cell includes a plurality of opposing terminal ends formed by a gate pattern, and placed near the cell boundary so as to face the terminal ends of the gate patterns of the first cell. The opposing terminal ends are arranged at the same pitch as the gate patterns of the first cell in the second direction, are located at a same position in the first direction, and have a same width in the second direction. The second cell has a dummy pattern forming at least one of the plurality of opposing terminal ends, and a first transistor adjoining the dummy pattern in the first direction.

According to the second aspect, the at least three gate patterns of the first cell are arranged at the same pitch, and the terminal ends of the gate patterns are located at the same position in the first direction, and have the same width in the second direction. The second cell, which adjoins the first cell in the first direction, has the dummy pattern and the first transistor adjoining the dummy pattern in the first direction. The dummy pattern forms the at least part of the opposing terminal ends placed so as to face the terminal ends of the gate patterns of the first cell. The opposing terminal ends are arranged at the same pitch as the gate patterns of the first cell, are located at the same position in the first direction, and have the same width in the second direction. That is, since the terminal ends of the gate patterns of the first cell and the opposing terminal ends of the gate pattern of the second cell have the same shape regularity, a variation in gate length due to the optical proximity effect can be reliably reduced. Moreover, the first transistor in the second cell can be used as, e.g., a transistor having a great gate length.

A semiconductor device according to a third aspect of the present invention includes: a first cell placed at an end of a cell placement region, and having at least three gate patterns extending in a first direction and arranged at a same pitch in a second direction perpendicular to the first direction; and a dummy pattern placed outside the cell placement region, and adjoining the first cell in the first direction. The gate patterns of the first cell are terminated near a cell boundary with the dummy pattern, and terminal ends of the gate patterns are located at a same position in the first direction, and have a same width in the second direction. The dummy pattern has a pattern main body extending in the second direction, and at least two protruding portions protruding from the pattern main body toward the first cell in the first direction. The protruding portions form a plurality of opposing terminal ends placed near the cell boundary so as to face the terminal ends of the gate patterns of the first cell. The opposing terminal ends are arranged at the same pitch as the gate patterns of the first cell in the second direction, are located at a same position in the first direction, and have a same width in the second direction.

According to the third aspect, the first cell placed at the end of the cell placement region has the at least three gate patterns arranged at the same pitch. The terminal ends of the gate patterns are located at the same position in the first direction, and have the same width in the second direction. The dummy pattern adjoining the first cell in the first direction is placed outside the cell placement region. The dummy pattern has the pattern main body extending in the second direction, and the at least two protruding portions protruding from the pattern main body toward the first cell in the first direction. These protruding portions form the opposing terminal ends placed so as to face the terminal ends of the gate patterns of the first cell. The opposing terminal ends are arranged at the same pitch as the gate patterns of the first cell, are located at the same position in the first direction, and have the same width in the second direction. That is, since the terminal ends of the gate patterns of the first cell and the opposing terminal ends formed by the protruding portions of the dummy pattern have the same shape regularity, a variation in gate length due to the optical proximity effect can be reliably reduced.

The semiconductor device of the present invention enables flexible layout design to be implemented while reliably reducing a variation in gate length due to the optical proximity effect.

DETAILED DESCRIPTION

Embodiments of the present invention will be described in detail below with reference to the accompanying drawings.

First Embodiment

Figure 1:
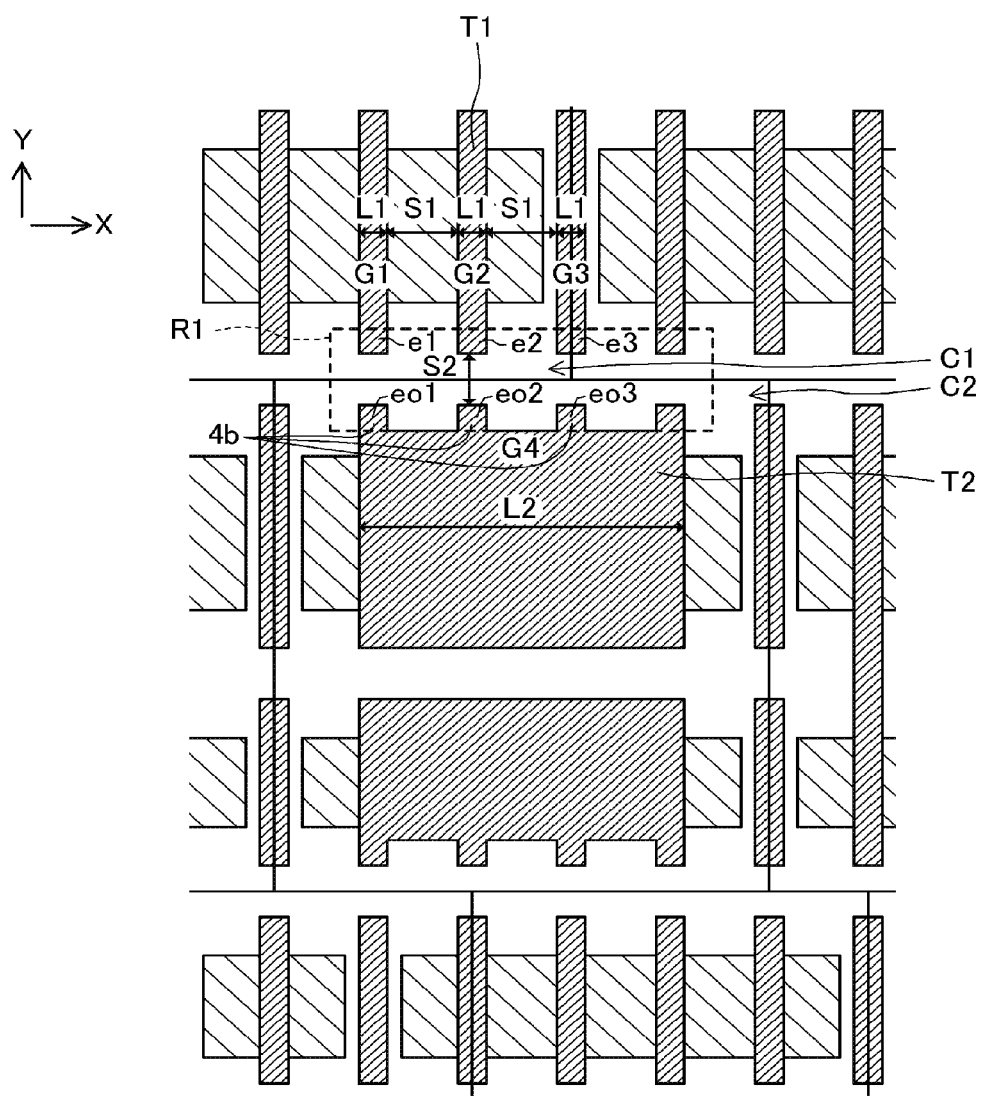
FIG. 1 is a schematic diagram of a layout pattern of a semiconductor device according to a first embodiment.

FIG. 1 is a schematic diagram of a layout pattern of a semiconductor device according to a first embodiment. FIG. 1 shows a layout of gate patterns and diffusion regions, and the cell boundaries are shown by solid lines (the same applies to the other figures). Note that the term "gate patterns" refers to patterns formed in a layer that is used for gate electrodes of transistors, and these patterns are fabricated by using a material such as polysilicon. The transistors are formed by the gate patterns and the diffusion regions, and a portion of the gate pattern interposed between the diffusion regions functions as a transistor gate. As shown in FIG. 1, a standard cell C1 as a first cell has gate patterns G1, G2, G3 extending in the Y direction (the vertical direction in the figure) as a first direction and arranged at the same pitch in the X direction (the horizontal or lateral direction in the figure) as a second direction. The gate patterns G1, G2, G3 have a width L1 and are arranged at an interval S1, and the gate pattern G2 forms a transistor T1. The width L1 and the interval S1 of the gate patterns G1, G2, G3 usually have minimum values in order to arrange transistors with high area efficiency.

A standard cell C2 as a second cell adjoins the standard cell C1 in the Y direction. The standard cell C2 has a single large gate pattern G4 as a first gate pattern for forming a transistor T2 functioning as a capacitance transistor. The width of the gate pattern G4, namely the gate length L2 of the transistor T2, is greater than the gate length L1 of the transistor T1 as a second transistor.

Figure 2:
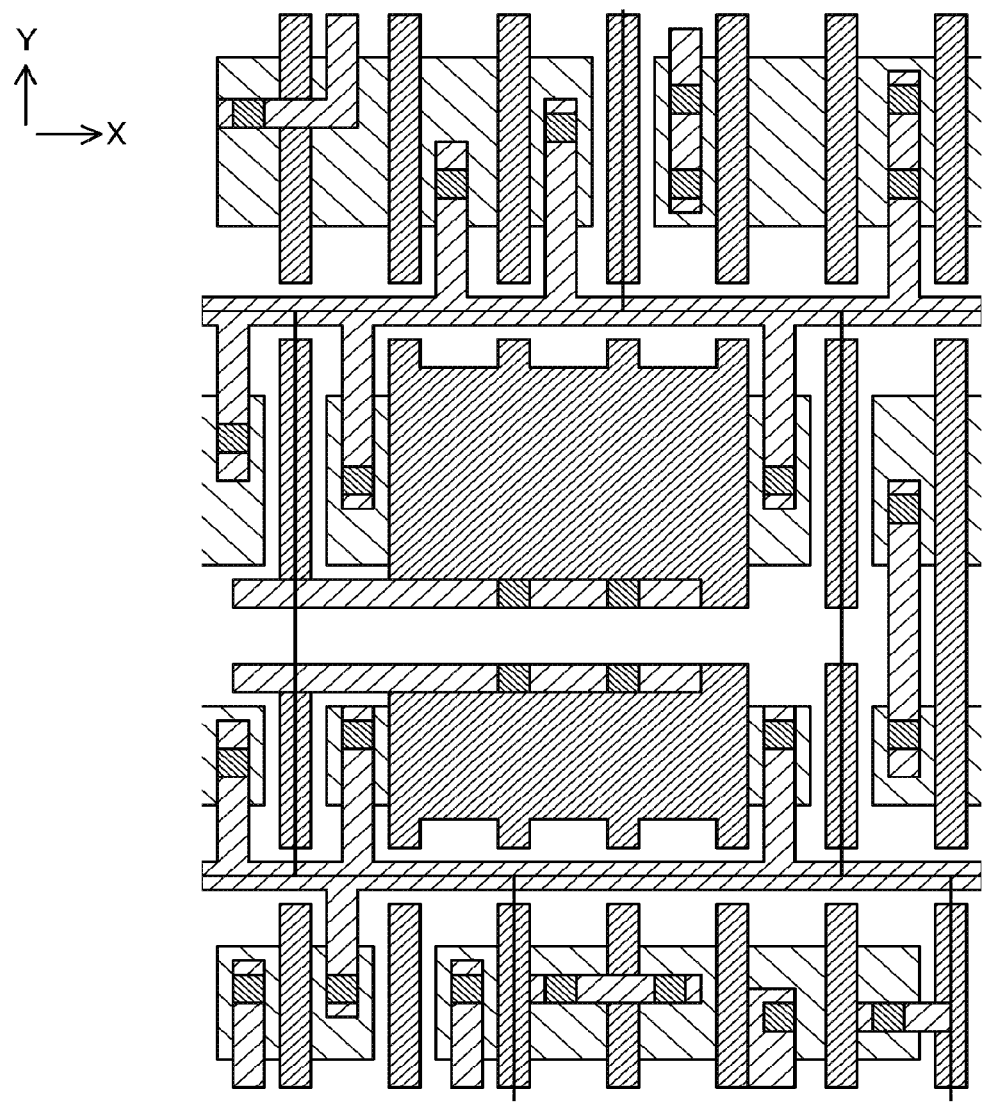
FIG. 2 is a schematic diagram having metal interconnects and contacts added to FIG. 1.

FIG. 2 is a schematic diagram having metal interconnects and contacts added to the layout pattern of FIG. 1.

A terminal end region R1 will be described below. The terminal end region R1 is a region where the gate patterns G1, G2, G3 of the standard cell C1 face the gate pattern G4 of the standard cell C2. The gate patterns G1, G2, G3 are terminated near the cell boundary, and terminal ends e1, e2, e3 of the gate patterns G1, G2, G3 are located at the same position in the Y direction, and have the same width (that is, the width L1) in the X direction. On the other hand, the gate pattern G4 has a plurality of protruding portions 4b protruding toward the standard cell C1 in the Y direction, and these protruding portions 4b form opposing terminal ends eo1, eo2, eo3 that are arranged so as to face the terminal ends e1, e2, e3 of the gate patterns G1, G2, G3. That is, the gate pattern G4 has a comb-shaped end on the side of the standard cell 1. The opposing terminal ends eo1, eo2, eo3 are arranged at the same pitch as the gate patterns G1, G2, G3 in the X direction, are located at the same position in the Y direction, and have the same width in the X direction. That is, the terminal ends e1, e2, e3 and the opposing terminal ends eo1, eo2, eo3 have the same shape regularity in the terminal end region R1.

As described above, the configuration of FIG. 1 enables the transistor T2 having a great gate length to be placed in the standard cell C2 while maintaining the shape regularity of the opposing gate patterns in the terminal end region R1 at the cell boundary between the standard cells C1, C2. Thus, a variation in gate length due to the optical proximity effect can be reliably reduced while ensuring sufficiently high capacitance capability when using the transistor T2 as a capacitance transistor. Note that the transistor T2 may be used as a transistor that contributes to circuit functions.

Figure 3:
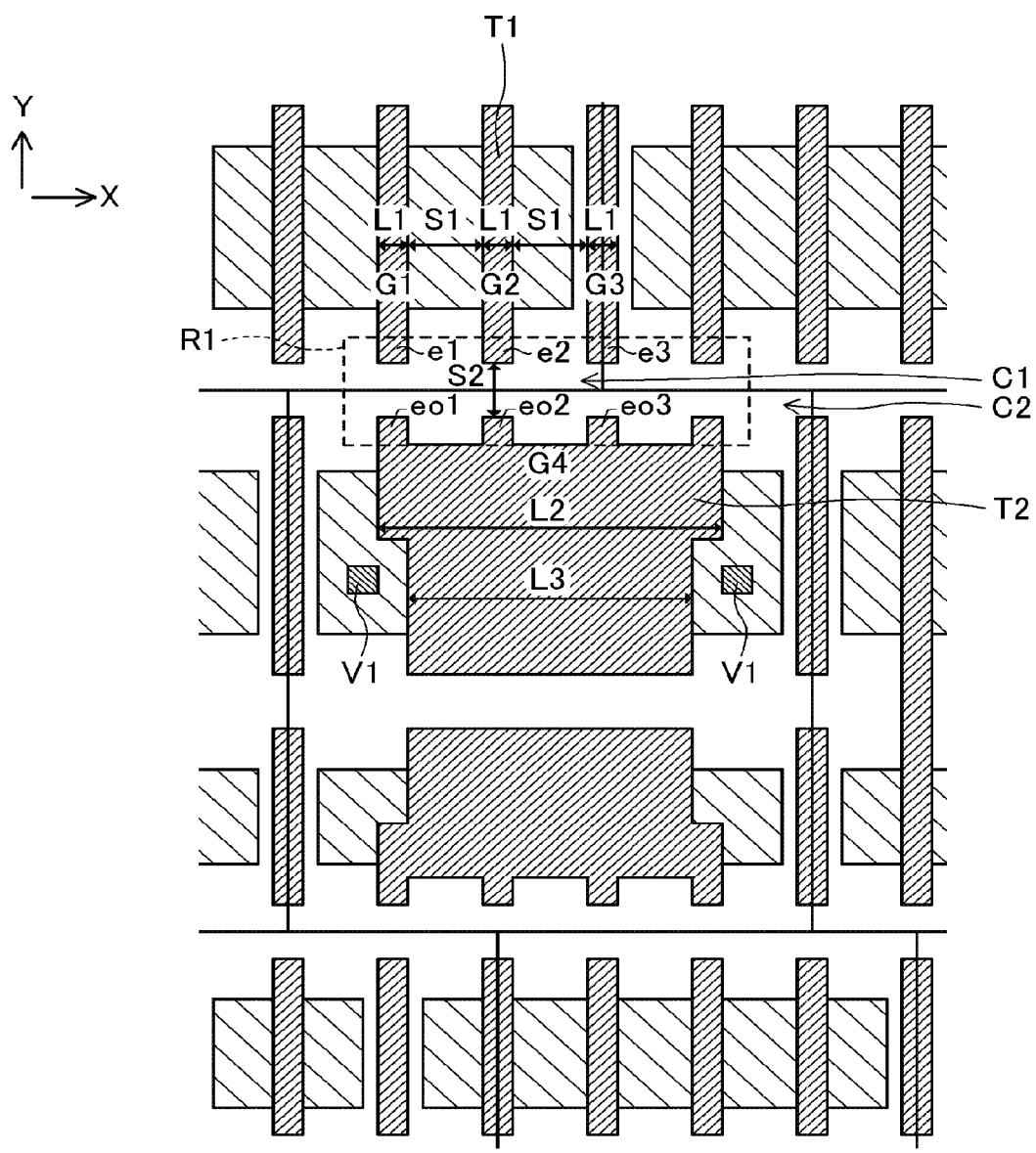
FIG. 3 is a schematic diagram of a layout pattern of a semiconductor device according to a modification of the first embodiment.

FIG. 3 is a schematic diagram of a layout pattern of a semiconductor device according to a modification of the present embodiment. The configuration of FIG. 3 is substantially similar to that of FIG. 1, but the shape of the gate pattern G4 of the standard cell C2 is slightly different from that in FIG. 1. That is, the lateral sides of the gate pattern G4 are partially cut out to form a portion having a smaller width L3 than the width L2. Thus, the capacitance transistor T2 has a plurality of gate lengths L2, L3 in order to reliably place contacts V1 in the capacitance transistor T2. In other words, since the transistor T2 has a large gate length L2, the gate pattern G4 is recessed so that the contacts V1 can be placed with an adequate margin from the minimum processing dimensions. This configuration enables the contacts V1 to be reliably placed in the capacitance transistor T2 while reliably reducing a variation in gate length due to the optical proximity effect.

Figure 4:
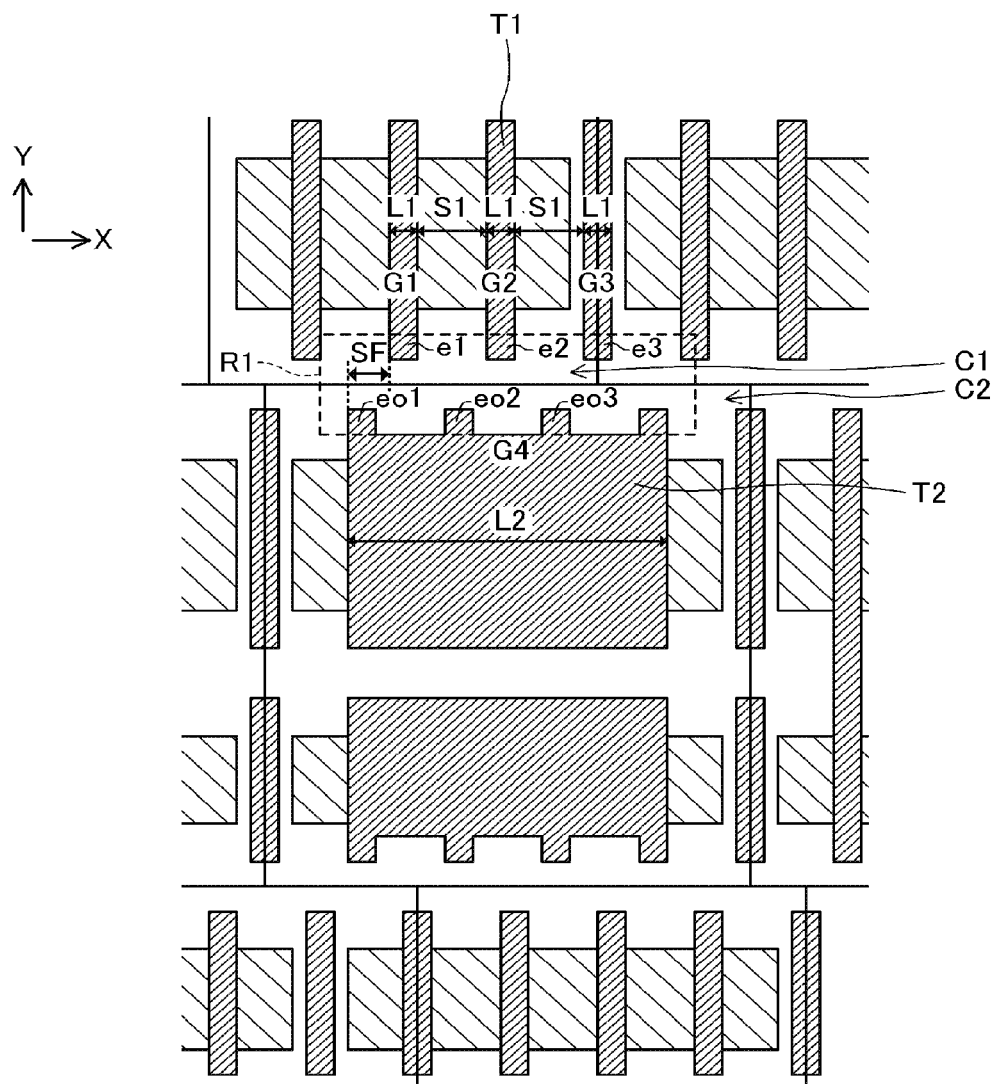
FIG. 4 is a schematic diagram of a layout pattern of a semiconductor device according to another modification of the first embodiment.

FIG. 4 is a schematic diagram of a layout pattern of a semiconductor device according to another modification of the first embodiment. The configuration of FIG. 4 is substantially similar to that of FIG. 1 except that the terminal ends e1, e2, e3 are shifted from the opposing terminal ends eo1, eo2, eo3 by half the pitch in the X direction (a shift amount SF) in the terminal end region R1. That is, in the configuration of FIG. 1, the terminal ends e1, e2, e3 and the opposing terminal ends eo1, eo2, eo3 are located at the same position in the X direction, and thus the terminal ends e1, e2, e3 face the opposing terminal ends eo1, eo2, eo3 in a perfectly aligned manner. However, in the configuration of FIG. 4, the terminal ends e1, e2, e3 are shifted from the opposing terminal ends eo1, eo2, eo3 by half the pitch while maintaining the same shape regularity. Like the configuration of FIG. 1, the configuration of FIG. 4 can also reliably reduce a variation in gate length due to the optical proximity effect.

Moreover, the configuration of FIG. 4 can further reduce the gap between the gate patterns G1, G2, G3 and the gate pattern G4, namely the gap between the standard cells C1, C2, and thus can increase the area efficiency of the semiconductor device. Note that although the shift amount SF is half the pitch in the example of FIG. 4, the present invention is not limited to this.

Second Embodiment

Figure 5:
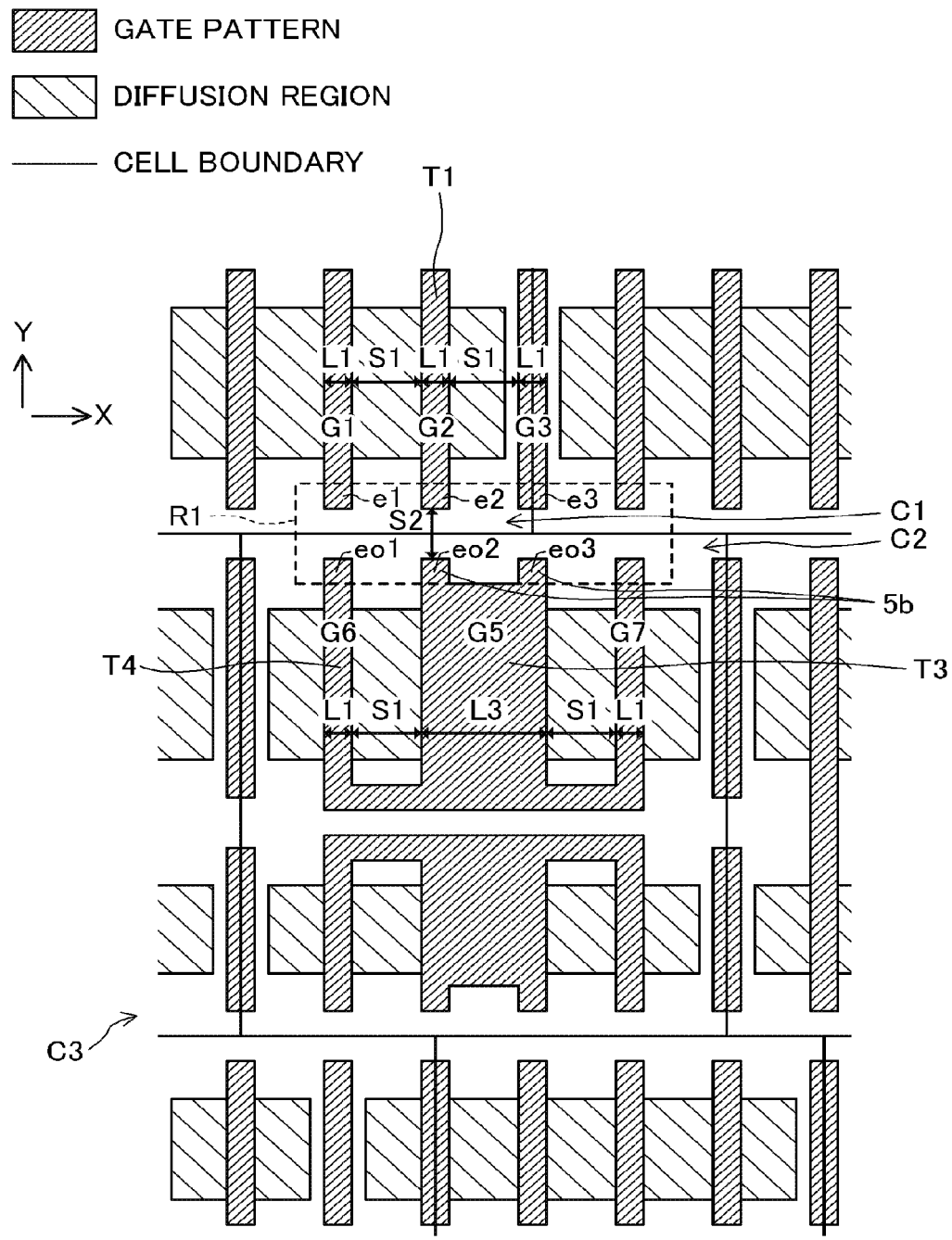
FIG. 5 is a schematic diagram of a layout pattern of a semiconductor device according to a second embodiment.

FIG. 5 is a schematic diagram of a layout pattern of a semiconductor device according to a second embodiment. The configuration of FIG. 5 is substantially similar to that of FIG. 1, and the same shape regularity of the terminal ends e1, e2, e3 and the opposing terminal ends eo1, eo2, eo3 is maintained in the terminal end region R1. However, the internal configuration of the standard cell C2 is different from that of FIG. 1.

In FIG. 5, the standard cell C2 has a single large gate pattern G5 as a first gate pattern. The width of the gate pattern G5, namely the gate length L3 of a transistor T3, is greater than the gate length L1 of the transistor T1. The gate pattern G5 has a plurality of protruding portions 5b protruding toward the standard cell C1 in the Y direction. These protruding portions 5b form the opposing terminal ends eo2, eo3. That is, the gate pattern G5 has a comb-shaped end on the side of the standard cell C1.

Gate patterns G6, G7 are provided on both sides of the gate pattern G5 in the X direction. The gate patterns G6, G7 have a width L1, and are separated from the gate pattern G5 by an interval S1. The gate pattern G6 as a second gate pattern forms another transistor T4 adjoining the transistor T3, and forms the opposing terminal end eo1. The gate pattern G5 is electrically connected to the gate patterns G6, G7.

Like the configuration of FIG. 1, the configuration of FIG. 5 enables the transistor T3 having a great gate length to be placed in the standard cell C2 while maintaining the same shape regularity of the opposing gate patterns in the terminal end region R1 at the cell boundary between the standard cells C1, C2. Thus, a variation in gate length due to the optical proximity effect can be reliably reduced while ensuring sufficiently high capacitance capability as a capacitance transistor when using the transistor T3 as a capacitance transistor.

Moreover, since the transistor T4 is placed near the transistor T3 having a great gate length, the influence of the optical proximity effect on, e.g., a transistor in a standard cell C3 adjoining the standard cell C2 can be reduced. Thus, a variation in gate length due to the optical proximity effect can be more reliably reduced.

The transistor T3 having a great gate length in the standard cell C2 may be used either as a capacitance transistor or a transistor that contributes to circuit functions.

Figure 6:
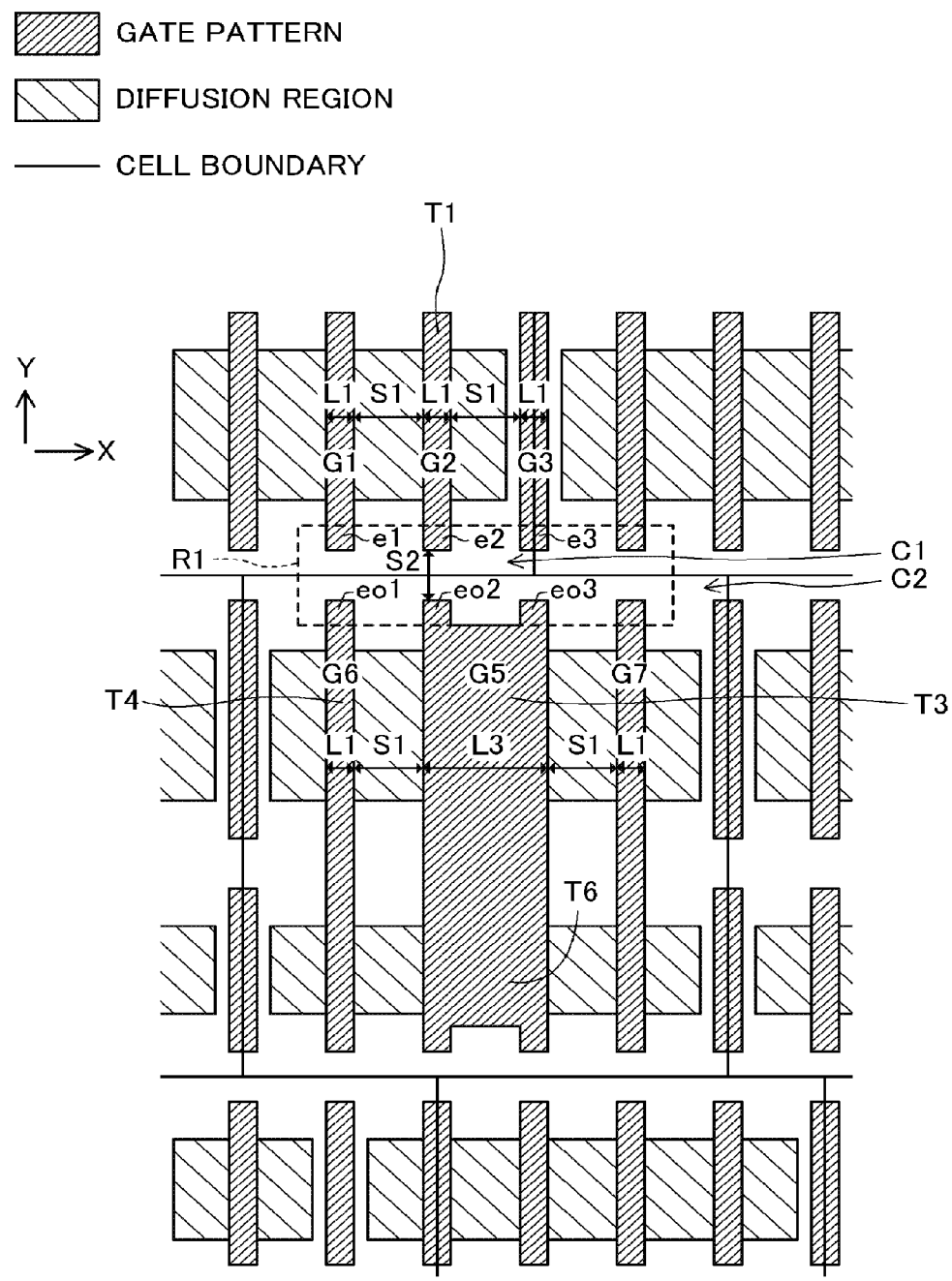
FIG. 6 is a schematic diagram of a layout pattern of a semiconductor device according to a modification of the second embodiment.

FIG. 6 is a schematic diagram of a layout pattern of a semiconductor device according to a modification of the present embodiment. In the configuration of FIG. 6, the gate of the transistor T3 is connected to the gate of a transistor T6 adjoining the transistor T3 in the Y direction, and is used as a transistor contributing to circuit functions and having reduced current capability. Thus, according to the present embodiment, flexible transistor design in the cells can be implemented while reliably reducing a variation in gate length due to the optical proximity effect.

Note that in the present embodiment as well, the terminal ends e1, e2, e3 may be shifted from the opposing terminal ends eo1, eo2, oe3 in the X direction in the terminal end region R1 in a manner similar to that described in the first embodiment.

Third Embodiment

Figure 7:
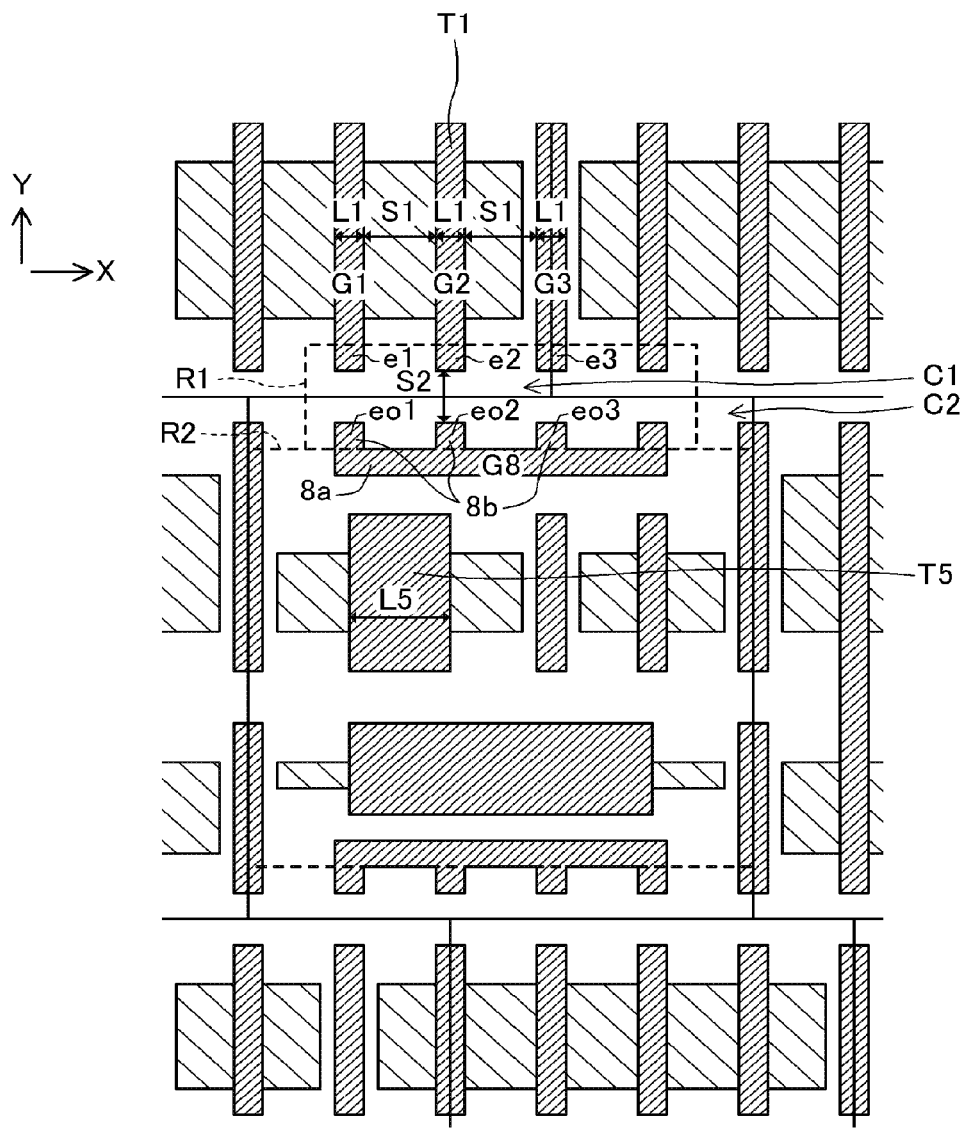
FIG. 7 is a schematic diagram of a layout pattern of a semiconductor device according to a third embodiment.

FIG. 7 is a schematic diagram of a layout pattern of a semiconductor device according to a third embodiment. The configuration of FIG. 7 is substantially similar to that of FIG. 1, and the same shape regularity of the terminal ends e1, e2, e3 and the opposing terminal ends eo1, eo2, eo3 is maintained in the terminal end region R1. However, the internal configuration of the standard cell C2 is different from that of FIG. 1.

In FIG. 7, the standard cell C2 has a single gate pattern G8 as a first gate pattern. The gate pattern G8 is a dummy pattern, and has a pattern main body 8a extending in the X direction, and a plurality of protruding portions 8b protruding from the pattern main body 8a toward the standard cell C1 in the Y direction. These protruding portions 8b form the opposing terminal ends eo1, eo2, eo3. That is, the gate pattern G8 has a so-called crown shape. In a region R2 where a transistor is to be placed (hereinafter referred to as the "transistor placement region R2"), a transistor T5 as a first transistor is placed so as to adjoin the gate pattern G8 in the Y direction. The gate length L5 of the transistor T5 is greater than the gate length L1 of the transistor T1.

In the configuration of FIG. 7, since the gate pattern G8 as a dummy pattern is placed, the same shape regularity of the opposing gate patterns is maintained in the terminal end region R1 at the cell boundary between the standard cells C1, C2. Moreover, a transistor can be arbitrarily placed in the transistor placement region R2. Thus, a variation in gate length due to the optical proximity effect can be reliably reduced while enabling flexible transistor design in the standard cell C2 to be implemented.

Figure 8:
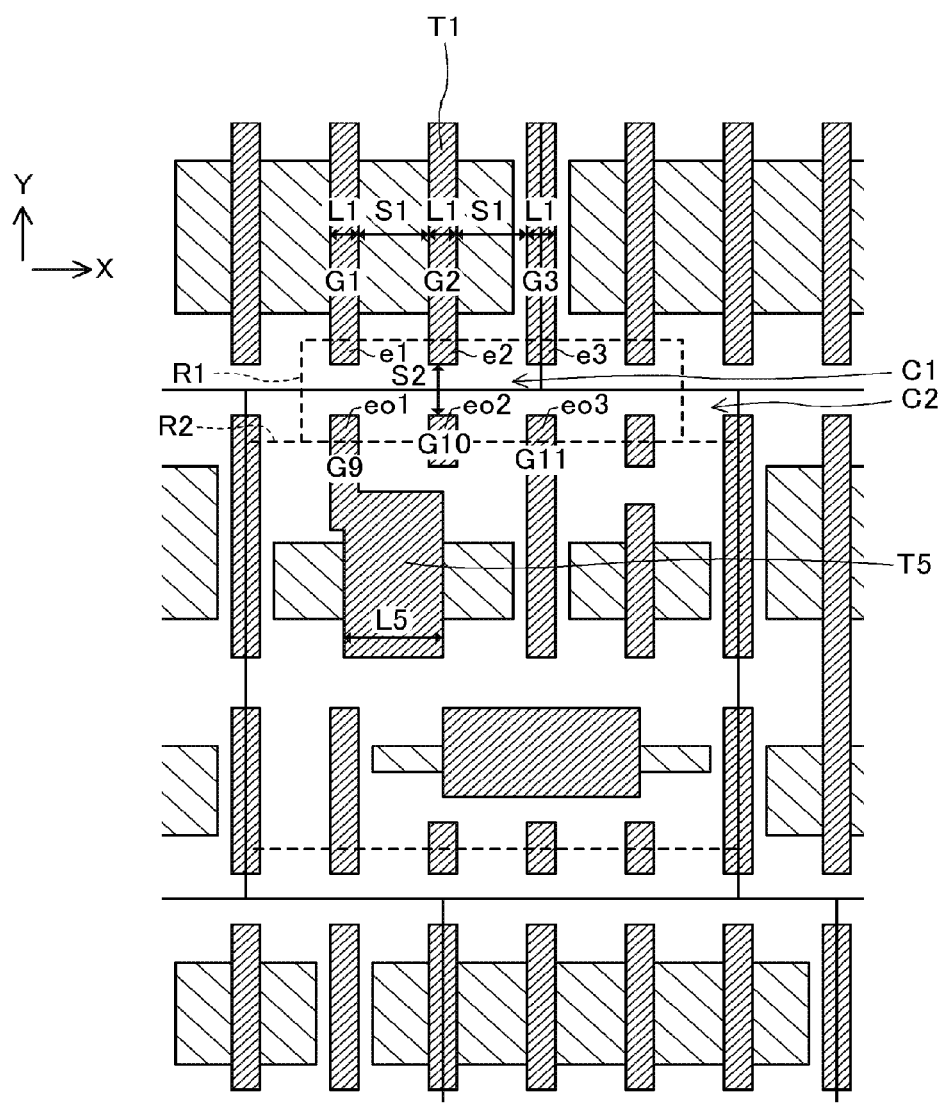
FIG. 8 is a schematic diagram of a layout pattern of a semiconductor device according to a modification of the third embodiment.

FIG. 8 is a schematic diagram of a layout pattern of a semiconductor device according to a modification of the present embodiment. In the configuration of FIG. 8, gate patterns G9, G10, G11 as fragmented dummy patterns form the opposing terminal ends eo1, eo2, eo3 in the terminal end region R1, respectively. In the configuration of FIG. 8 as well, the same shape regularity of the opposing gate patterns is maintained in the terminal end region R1 at the cell boundary between the standard cells C1, C2, and a transistor can be arbitrarily placed in the transistor placement region R2, as in the configuration of FIG. 7. Thus, a variation in gate length due to the optical proximity effect can be reliably reduced while enabling flexible transistor design in the standard cell C2 to be implemented.

Note that in the present embodiment as well, the terminal ends e1, e2, e3 may be shifted from the opposing terminal ends eo1, eo2, eo3 in the X direction in the terminal end region R1 in a manner similar to that described in the first embodiment.

Fourth Embodiment

Figure 9:
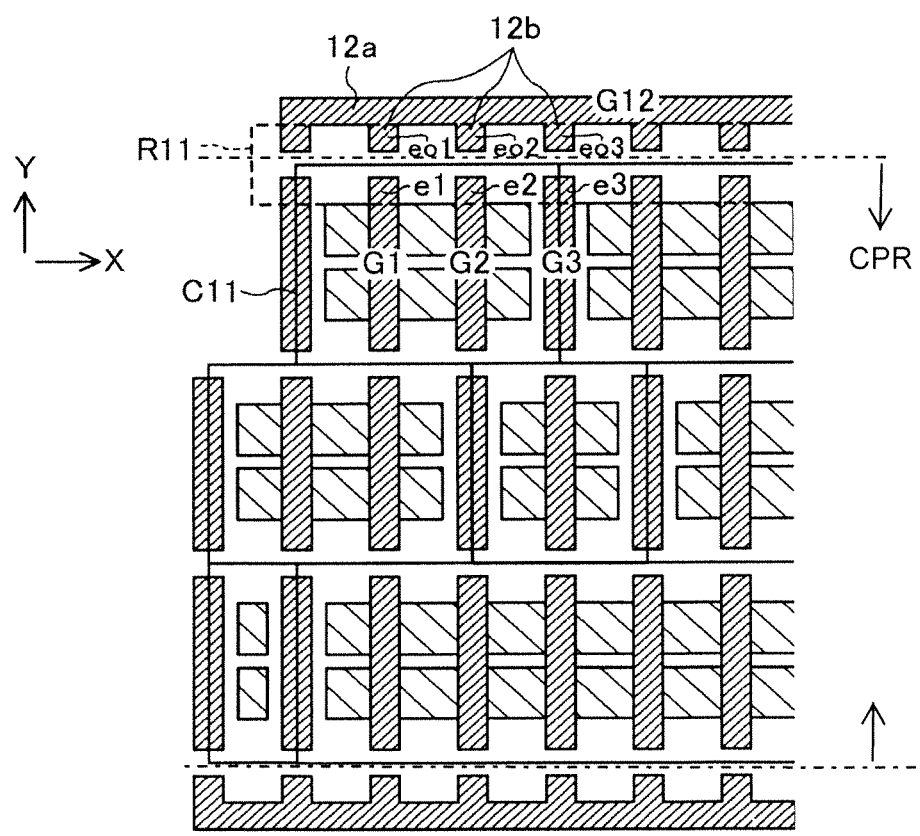
FIG. 9 is a schematic diagram of a layout pattern of a semiconductor device according to a fourth embodiment.

FIG. 9 is a schematic diagram of a layout pattern of a semiconductor device according to a fourth embodiment. In the configuration of FIG. 9, a standard cell C11 as a first cell is placed at an end of a region where cells are to be placed (hereinafter referred to as the "cell placement region CPR"). The standard cell C11 has gate patterns G1, G2, G3 extending in the Y direction and arranged at the same pitch in the X direction. A gate pattern G12 as a dummy pattern is provided outside the cell placement region so as to adjoin the standard cell C11 in the Y direction. Like the gate pattern G8 of FIG. 7, the gate pattern G12 has a crown shape, and has a pattern main body 12a extending in the X direction, and a plurality of protruding portions 12b protruding from the pattern main body 12a toward the standard cell C11 in the Y direction.

The gate patterns G1, G2, G3 of the standard cell C11 are terminated near the cell boundary, and terminal ends e1, e2, e3 of the gate patterns G1, G2, G3 are located at the same position in the Y direction, and have the same width in the X direction. The protruding portions 12b of the gate pattern G12 form opposing terminal ends eo1, eo2, eo3 arranged so as to face the terminal ends e1, e2, e3 of the gate patterns G1, G2, G3. The opposing terminal ends eo1, eo2, eo3 are arranged at the same pitch as the gate patterns G1, G2, G3 in the X direction, are located at the same position in the Y direction, and have the same width in the X direction. That is, the same shape regularity of the terminal ends e1, e2, e3 and the opposing terminal ends eo1, eo2, eo3 is maintained in a terminal end region R11.

In the configuration of FIG. 9, since the gate pattern G12 as a crown-shaped dummy pattern is provided outside the cell placement region, the same shape regularity of the opposing gate patterns can be maintained in the terminal end region R11 at the cell boundary at the end of the cell placement region. Thus, a variation in gate length due to the optical proximity effect can also be reliably reduced in the standard cell C11 located at the end of the cell placement region.

Figure 10:
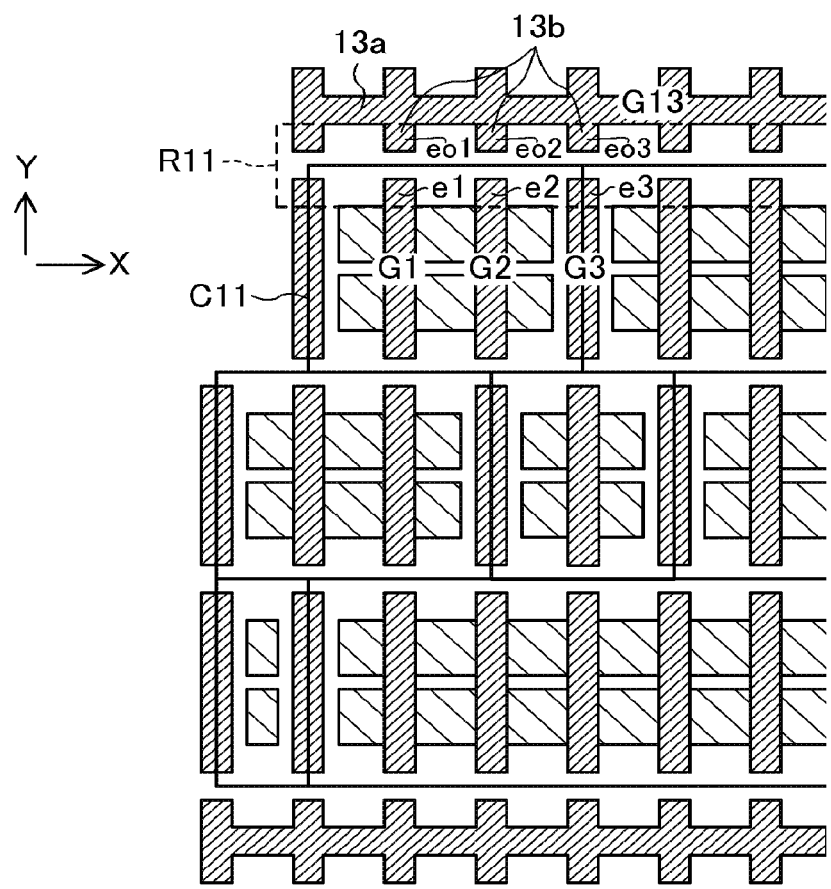
FIG. 10 is a schematic diagram of a layout pattern of a semiconductor device according to a modification of the fourth embodiment.
Figure 11:
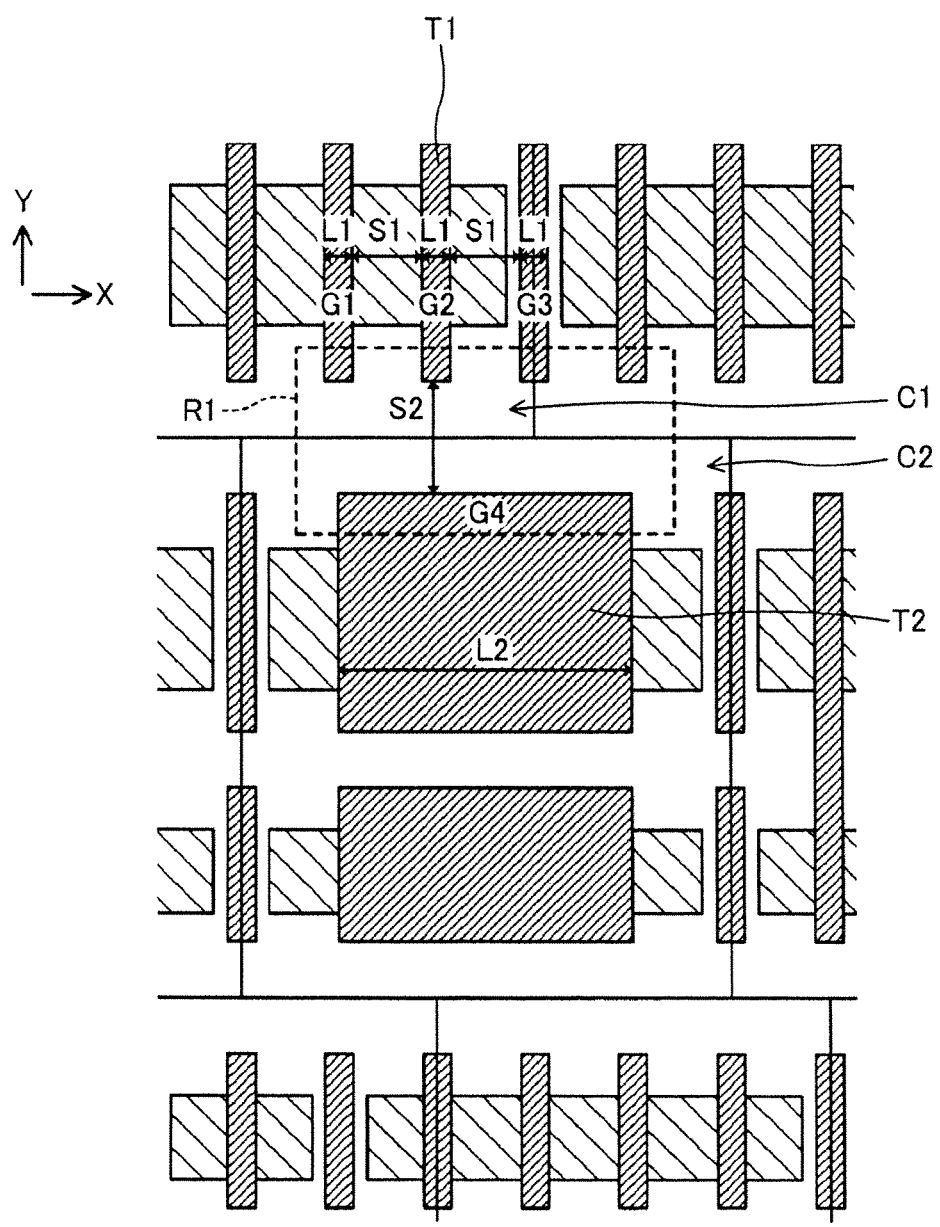
FIG. 11 shows an example of a layout pattern of a semiconductor device in which a capacitance transistor is placed.

FIG. 10 is a schematic diagram of a layout pattern of a semiconductor device according to a modification of the present embodiment. In the configuration of FIG. 10, a gate pattern G13 as a dummy pattern is provided outside the cell placement region. The gate pattern G13 is different in shape from the gate pattern G12 of FIG. 9. The gate pattern G13 has an "H" shape, and has a pattern main body 13a extending in the X direction, and a plurality of protruding portions 13b protruding from the pattern main body 13a in the Y direction. Those protruding portions 13b protruding from the pattern main body 13a toward the standard cell C11 in the Y direction form the opposing terminal ends eo1, eo2, eo3. The configuration of FIG. 10 has an advantage in that the gate pattern G13 is stably formed, in addition to advantages similar to those of the configuration of FIG. 9.

Note that in the present embodiment as well, the terminal ends e1, e2, e3 may be shifted from the opposing terminal ends eo1, eo2, eo3 in the X direction in the terminal end region R11 in a manner similar to that described in the first embodiment.

Note that the shape of the gate pattern placed outside the cell placement region is not limited to the crown shape and the "H" shape described above, and similar advantages can be obtained as long as the gate pattern is shaped to have, e.g., such opposing terminal ends as shown in the other embodiments.

In the semiconductor device of the present invention, flexible layout design can be implemented while reducing the possibility of a variation in gate length due to the optical proximity effect. Thus, the semiconductor device of the present invention can be used for, e.g., semiconductor integrated circuits that are placed in various electronic apparatuses, etc.

What is claimed is:

1. A semiconductor device having a layout structure, the layout structure comprising:
   a first cell placed at an end of a cell placement region, and having gate patterns extending in a first direction and arranged at a first pitch in a second direction perpendicular to the first direction, the gate patterns including at least two gate patterns placed on a diffusion layer; and
   a dummy pattern placed outside the cell placement region, and adjoining the first cell in the first direction, the dummy pattern being not a part of or not connected to a gate electrode of a transistor, wherein:
   the gate patterns of the first cell are terminated near a cell boundary with the dummy pattern, and terminal ends of the gate patterns are located at a same position in the first direction, and have a same width in the second direction,
   the dummy pattern has a pattern main body extending in the second direction, and at least two protruding portions protruding from the pattern main body toward the first cell in the first direction,
   the protruding portions form a plurality of opposing terminal ends placed near the cell boundary so as to face the terminal ends of the gate patterns of the first cell, respectively, and
   the opposing terminal ends are arranged at the first pitch in the second direction, are located at a same position in the first direction, and have a same width in the second direction.

2. The semiconductor device of claim 1, wherein the terminal ends and the opposing terminal ends are located at a same position in the second direction.

3. The semiconductor device of claim 1, wherein the terminal ends are shifted from the opposing terminal ends by half the first pitch in the second direction.

* * * * *